United States Patent [19]

Maeda et al.

[11] Patent Number: 4,664,945
[45] Date of Patent: May 12, 1987

[54] METHOD OF FORMING THICK FILM CIRCUITS

[75] Inventors: Yukio Maeda, Hirakata; Shinichi Kudo, Neyagawa, both of Japan

[73] Assignee: Matsushita Electric Industrial Co., Ltd., Osaka, Japan

[21] Appl. No.: 638,713

[22] Filed: Aug. 8, 1984

[30] Foreign Application Priority Data

Aug. 19, 1983 [JP] Japan ............................... 58-152021

[51] Int. Cl.$^4$ .............................................. B05D 5/12
[52] U.S. Cl. ...................................... 427/96; 427/102
[58] Field of Search ................................ 427/96, 102

[56] References Cited

U.S. PATENT DOCUMENTS

| | | | |
|---|---|---|---|
| 3,820,121 | 6/1974 | Rich et al. | 346/140 |
| 3,864,695 | 2/1975 | Nagashima et al. | 346/139 R |
| 3,961,599 | 6/1976 | Jones, Jr. | 118/695 |
| 4,133,910 | 1/1979 | Ruwe et al. | 427/96 |
| 4,291,642 | 9/1981 | Kolc | 118/50 |
| 4,324,815 | 4/1982 | Mitani et al. | 427/96 |
| 4,327,124 | 4/1982 | DesMarais | 427/96 |
| 4,338,351 | 7/1982 | Bloom et al. | 427/102 |
| 4,485,387 | 11/1984 | Drumheller | 346/140 R |

OTHER PUBLICATIONS

Electronic Packing and Production, pp. 98–109, Jan. 1981.

*Primary Examiner*—Sadie L. Childs
*Attorney, Agent, or Firm*—Wenderoth, Lind & Ponack

[57] ABSTRACT

Disclosed is a method for forming thick film circuits or the like to be used when forming elements such as conductors and resistors on a thick film circuit board. The method is performed with a writing head for storing paste to form patterns and which lowers and approaches an arbitrary point in close proximity to the board of a thick film circuit and while same state, moves laterally to another other arbitrary point along the surface of the board, and then ascends to be separated from the board. The paste in the writing head is pressurized to be forced out of the head before the writing head begins to move laterally such that the paste is immediately applied on the board when the writing head begins to move laterally. This pressurization of the paste is stopped before the writing head finishes its lateral movement, so that the extrusion of the paste may be stopped the moment the writing head finishes the lateral movement. As a result, blurring or blotting at the beginning and ending part of the pattern writing may be prevented, so that patterns may be formed at high speed and with high precision.

6 Claims, 8 Drawing Figures

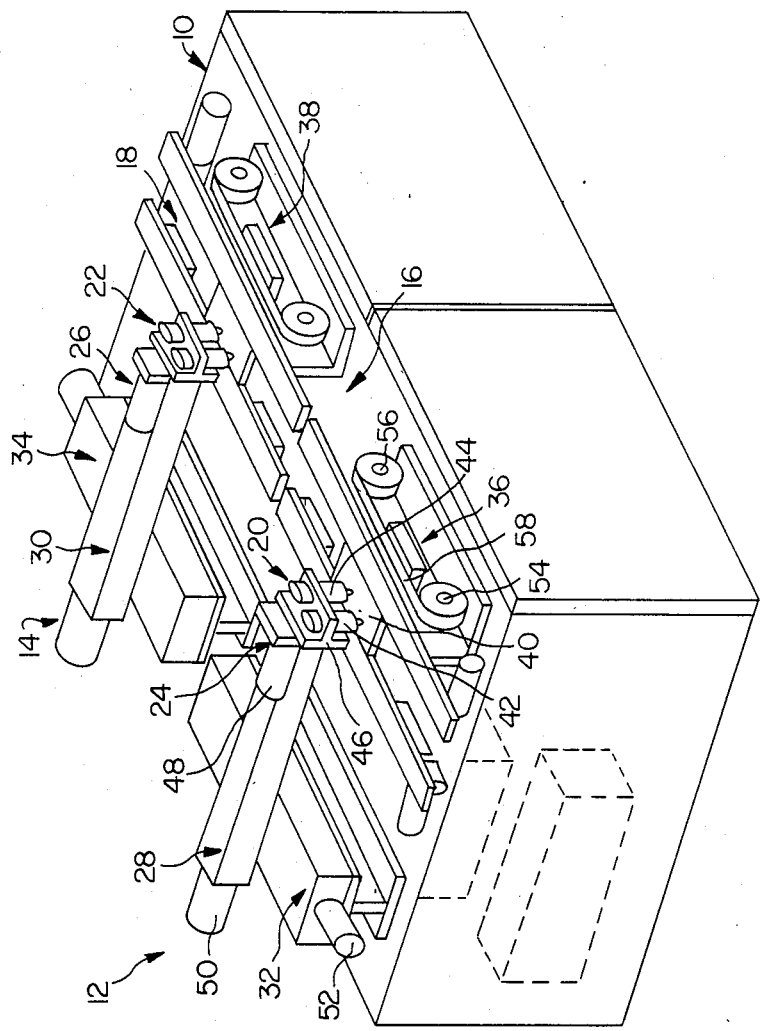
FIG. 1
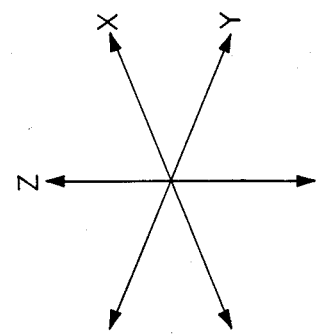

METHOD OF FORMING THICK FILM CIRCUITS

BACKGROUND OF THE INVENTION

The present invention relates to a method and apparatus of forming patterns of a thick film circuit or the like for use in forming of elements such as conductors and resistors on a thick film circuit board, and more particularly to a method and apparatus of forming patterns in thick film circuits or the like by a writing method which is capable of forming patterns of resistors and other elements at high speed and high precision.

Generally, a thick film circuit is one which has resistors, capacitors, conductors and other components formed on a relatively thick insulated board by depositing a relatively thin material layer on the insulated board. That is, as a first step, a conductor paste, which is a mixture of powder of silver-palladium compound or the like and glass frit dispersed in an organic solvent, is spread on an alumina ceramic board in a desired shape by a screen printing method. By heating at a relatively low temperature, the organic solvent in this conductor paste is dried and evaporated, and then the conductor paste is fired at a high temperature to form a conductor to be used as a wire. In a next step, a resistor paste of ruthenium oxide ($RuO_2$) compound is applied on the board by a screen printing method in such a manner that it is partly overlapped with the conductor formed thereon and a resistor is formed by drying and firing in a method similar to forming the conductor.

Thus, the conventional forming method of thick film circuits required screens because the conductors and resistors were formed by use of a screen printing method, and the screens were replaced whenever a model was changed or a circuit pattern was modified. In contrast, a method of extruding a thick film paste from a nozzle, applying it on an alumina ceramic board and forming a desired conductor pattern or resistor pattern was disclosed at the 1978 International Microelectronics Symposium of ISHM, Minneapolis, Minn., Sept. 17, 1978, and was published in the journal, "Electronic Packaging and Production", January 1981, pages 98 to 109. This method does not require a screen because of the use of the pattern writing method by numerical control, and is advantageous in that the model change or circuit pattern modification may be effected instantly.

In this writing method, however, when forming patterns at a high speed, it has sometimes occurred that patterns could not be formed at the desired positions. That is, due to a response delay in an electric control system, response delay in an electromagnetic air valve, delay in pressure supply of air and other delays, one end of a resistor was not overlapped on a conductor, or two resistors contacted with each other. Accordingly, it was necessary to smooth the ends by slowing down the nozzle moving speed or scanning and writing while slightly deviating the position of the nozzle whose opening is small. Therefore, the writing method was useful for trial production of thick film circuits, but was not suited for mass production.

SUMMARY OF THE INVENTION

It is a principal object of this invention to provide a method and apparatus of forming patterns of thick film circuits or the like by use of a writing method which is capable of forming patterns of elements such as resistors of a thick film circuit or the like at high speed and with high precision.

This and other objects are accomplished by an apparatus for forming patterns of a thick film or the like comprising paste for forming patterns of a thick film circuit, writing heads for storing such pastes, extrusion means connected to each writing head for extruding the paste from the writing head by applying or supplying pressure from a source of compressed air thereto, first moving means for moving the writing head in a vertical direction towards and away from a board of a thick film circuit on which said patterns are formed, second moving means for moving the writing head laterally along the surface of the board, and a control circuit for moving the writing head in close proximity to the board by means of the first moving means, further moving the writing head, while it remains in close proximity to the board, along the surface of the board by the second moving means, moving the writing head away from the board by the first moving means at the end of the above movement, operating the extrusion means by the supply of compressed air to the extrusion means being initiated at a specified or predetermined time before the starting of the moving of the writing head by the second moving means, and stopping the operation of the extrusion means by the supply of the compressed air being terminated at a specified or predetermined time preceding termination of the lateral movement of the writing head by the second moving means, whereby the application of the paste on the board surface is stated at the same time when the writing head starts to move along the surface of the board, and the application of the paste is stopped at the same time when its moving along the surface of the board is stopped.

In a specific embodiment, the writing head includes a paste tank with a nozzle portion having an oval hole for extrusion of paste, and a hot water tank disposed around the paste tank for keeping the viscosity of the paste constant in the paste tank. The extrusion means contains an air pressure feed passage and an electromagnetic air valve located in the middle of this passage to start and stop the air feed, and the air pressure feed passage is communicated with the paste storing portion of the writing head. The first moving means comprises the Z-axis drive unit for raising or lowering the writing head to move it towards and away from the board. The second moving means comprises the X-axis, Y-axis drive unit for moving the writing head in a horizontal direction. The control circuit is composed of microcomputers. The writing head comprises a nozzle portion with an elongated opening for the extrusion of the paste, and a stylus is provided at the end of this nozzle portion and thus the stylus is on an end face of the writing head. When the writing head moves toward the board, this stylus abuts against the board, and a gap or predetermined for extrusion of paste is formed between the oval hole and the board. The extrusion means is operated by the first moving means while the writing head and the board are moving in mutually approaching directions, and is stopped by the second moving means while the writing head is moving along the surface of the board. The extrusion means may be designed to start its operation when the writing head has approached the board by means of the first moving means, and after the lapse of a specified period of time, the writing head starts to move along the surface of the board by means of the second moving means.

In another specific embodiment, the apparatus of this invention comprises paste for forming patterns of a thick film circuit or the like, a writing head for accommodating the paste, the writing head including a paste tank which has a nozzle portion with an oval hole for extruding paste, extrusion means for feeding or supplying air under pressure from a source of compressed air into the paste tank to pressurize and extrude the paste from the oval hole, the extrusion means including an electromagnetic air valve located in the midst of the pressure feed passage for starting and stopping the air feed, a vertical direction moving mechanism for lowering the writing head to a thick film circuit board on which said patterns are formed in such manner that a gap is formed for extruding the paste between the oval hole of the writing head and the board, a horizontal direction moving mechanism for moving the writing head in the horizontal direction along the surface of the board while keeping the gap constant between the hole and the oval board, and a microcomputer for controlling (a) movement of the writing head towards the board by means of the vertical direction moving mechanism to thereby position the head in such a manner that a specified gap between the hole and the oval board, (b) movement of the writing head horizontally along the surface of the board, while maintaining said gap, by means of said horizontal direction moving mechanism, (c) movement of the writing head away from the board by means of the vertical direction moving mechanism at the end of the horizontal moving of the head along the surface of the board, (d) the start of the pressurization of the paste by applying a release signal to the air valve at a specified time before the starting of the moving of the writing head by means of the horizontal direction moving mechanism, and (e) the end of the pressurization of the paste by applying a closing signal at to the air valve, a specified time before the ending of the moving of the writing head by means of the horizontal direction moving mechanism, whereby the steps of initiating and terminating the supply of compressed air to the extrusion means are controlled so that the extrusion or the application of the paste from the writing head onto the board surface is started or begins at the same time or normal the the writing head begins to move horizontally along the surface of the board which is at the moment of the start of lateral movement of the writing head, and the extrusion or application of the paste from the writing head is stopped or ends when the horizontal moving of the writing head is stopped which is at the moment of termination of the lateral movement of the writing head.

In a further specific embodiment, a stylus tip is provided at the end of the nozzle portion of the writing head. When the writing head moves toward the board, this stylus abuts against the board, and a gap for extrusion of the paste is formed between the oval hole and the board. The writing head is designed so that a release signal is applied to the electromagnetic air valve while the writing head is lowering, and that a closing signal is applied to the electromagnetic air valve while the writing head is moving horizontally. The moving speed of the writing head and its acceleraton and deceleration are variable. The timing for producing the release signal and the closing signal to the air valve is adjustable.

Moreover, the present invention includes the following pattern forming method. This is a method comprising a first step of moving a vertically movable writing head to an arbitrary point on a board on which a pattern is to be formed by the writing head for forming a pattern of a thick film circuit or the like, under the condition that the head is kept in raised state, a second step of lowering the writing head to said arbitrary point on the board, a third step of moving the writing head to a second arbitrary point on the board surface under the condition that the head is maintained close to the board surface, a fourth step of extruding the paste from the writing head and depositing the paste on the board surface for forming the pattern, and a fifth step of raising the writing head from said second arbitrary point on the board surface, wherein the operation of the paste extrusion mechanism is started within the duration of said first step of said second step.

Another pattern forming method of this invention is a method comprising a first step of moving the vertically movable writing head for forming a pattern of a thick film circuit or the like to an arbitrary point on the board on which the pattern is to be formed under the condition that the writing head is in the raised state, a second step of lowering the writing head to said arbitrary point on the board, a third step of moving the writing head to another arbitrary point on the board and at the same time extruding the paste for forming a pattern from the writing head to deposit it on the board surface under the condition that the writing head is maintained close to the board surface and a fourth step of raising the writing head from said other arbitrary point on the board surface.

By this invention thus explained, the following effects, among others, can be obtained.

Since the paste extrusion mechanism for forming a thick film circuit or the like is operated before the writing head completely moves to the position where writing should be actually started and is stopped before it completely moves to the position where writing should be stopped, the precision of writing position is high even if the circuit is written at a high speed, and writing defects such as a failure of overlapping of one end of a resistor with the conductor or contact of a resistor with another resistor may be prevented. In addition, when a writing head having a slit shaped-opening for extruding the paste is used, a pattern of a larger width may be written at high precision by one stroke, which is suited to mass production.

While the novel features of the invention are set forth with particularly in the appended claims, the invention, both as to organization and content, will be better understood and appreciated, along with other objects and features thereof, from the following detailed description in conjunction with the drawings.

BRIEF DESCRIPTION OF THE DRAWINGS

FIG. 1 is a perspective view showing the appearance of a pattern forming apparatus of a thick film circuit or the like according to the present invention;

DESCRIPTION OF THE PREFERRED EMBODIMENTS

Figure 2:
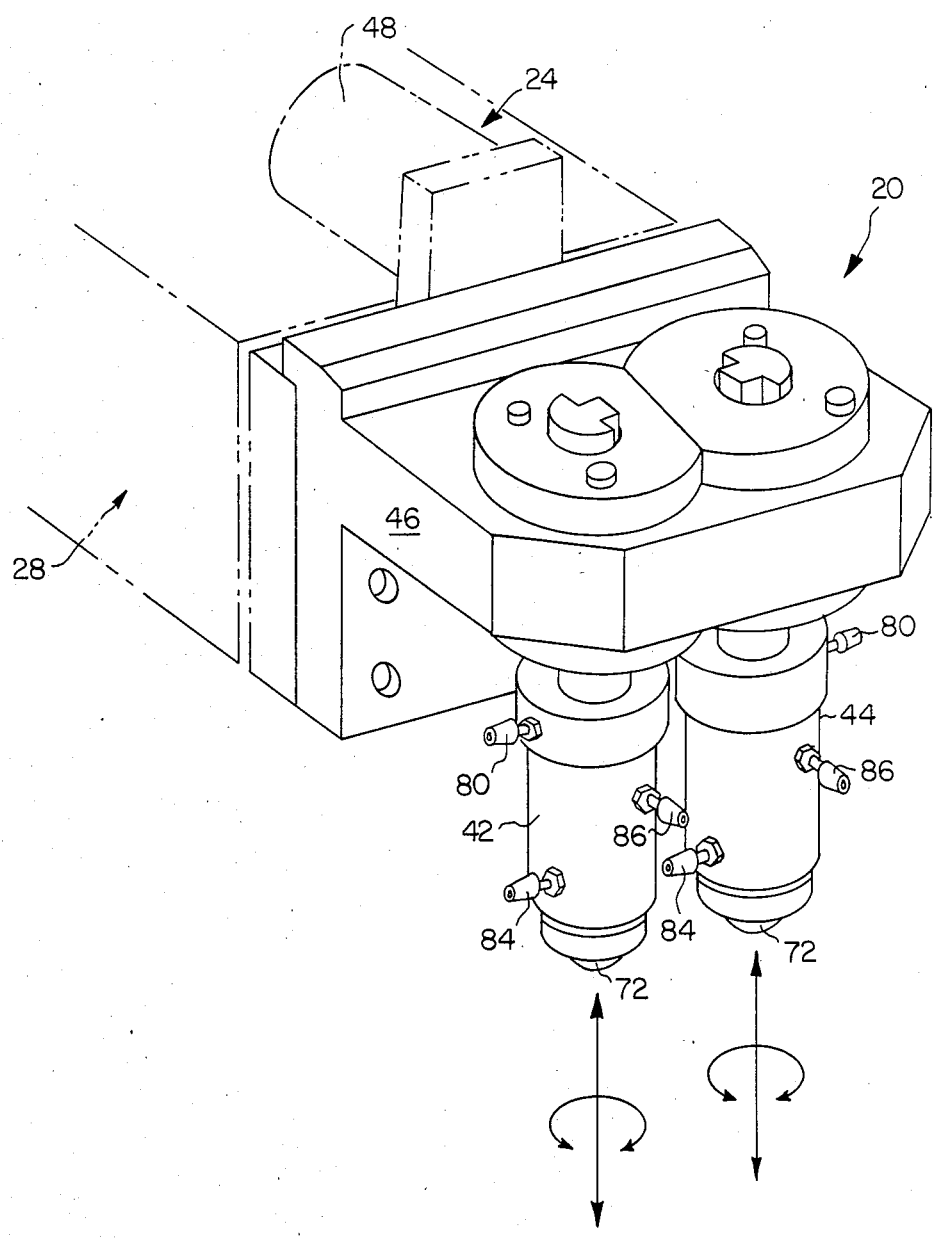
FIG. 2 is a perspective view showing a writing head of said pattern forming apparatus.

Referring first to FIG. 1, a pattern forming apparatus which is embodied in accordance with the present invention is explained. Two pattern forming apparatuses 12, 14 are disposed side by side on a base 10. These apparatuses 12, 14 are identical in structure, which include board carriers 16, 18 for conveying a board of a thick film circuit, writing head units 20, 22 for writing patterns on the board, Z-axis drive units 24, 26 for moving the writing head units 20, 22 in the Z-axis direction, i.e., the direction vertical to the top surface of the base 10, Y-axis drive units 28, 30 for moving the writing head units 20, 22 in the Y-axis direction, i.e., the direction parallel to the top surface of the base 10, X-axis drive units 32, 34 for moving the writing head units 20, 22 in the X-axis direction, i.e., the direction parallel to the top surface of the base and orthogonal to the Y-axis direction, and test writing units 36, 38 for keeping the writing head units 20, 22 always in stable and ready-to-write state.

Since the two pattern forming apparatuses 12, 14 are identical in structure as mentioned above, the following explanation is represented by only one of them, i.e., the apparatus 12. The board carrier 16 includes a board lifting unit 40 for moving the board vertically, in addition to the structure of conveying the boards such as a conveyor (not shown). This board lifting unit 40 lifts the board toward the writing head unit 20 when the board is conveyed to beneath the writing head unit 20 at the shown position. As the same time, the writing head unit 20 also descends toward the board, and the board is held between the writing head unit 20 and the board lifting unit 40 at a pressure suitable for writing a pattern, while excess pressure is absorbed as the board lifting unit 40 is elastically pushed down. The writing head unit 20 comprises two writing heads 42, 44 and a support plate 46 therefor. The Z-axis drive unit 24 includes a mechanism for moving the support plate 46 in the Z-axis direction (not shown) and a drive motor 48. The Y-axis drive unit 28 includes a mechanism for moving the writing head unit 20 in the Y-axis direction (not shown) and a drive motor 50. The X-axis drive unit 32 includes a mechanism for moving the writing head unit 20 in the X-axis direction (not shown) and a drive motor 52. The test writing unit 36 includes a tape 58 which can be transferred between shafts 54 and 56. When the writing operation is interrupted for more than 3 minutes during normal operation of the pattern forming apparatus, the writing head unit 20 is automatically moved to above the tape 58, and the writing heads 42, 44 descend onto the tape 58, thereby starting the writing actin. That is, if the writing action is interrupted for a long time during normal operation of the apparatus, test writing action is conducted every three minutes, so that drying of the paste in the writing heads may be prevented.

Figure 3:
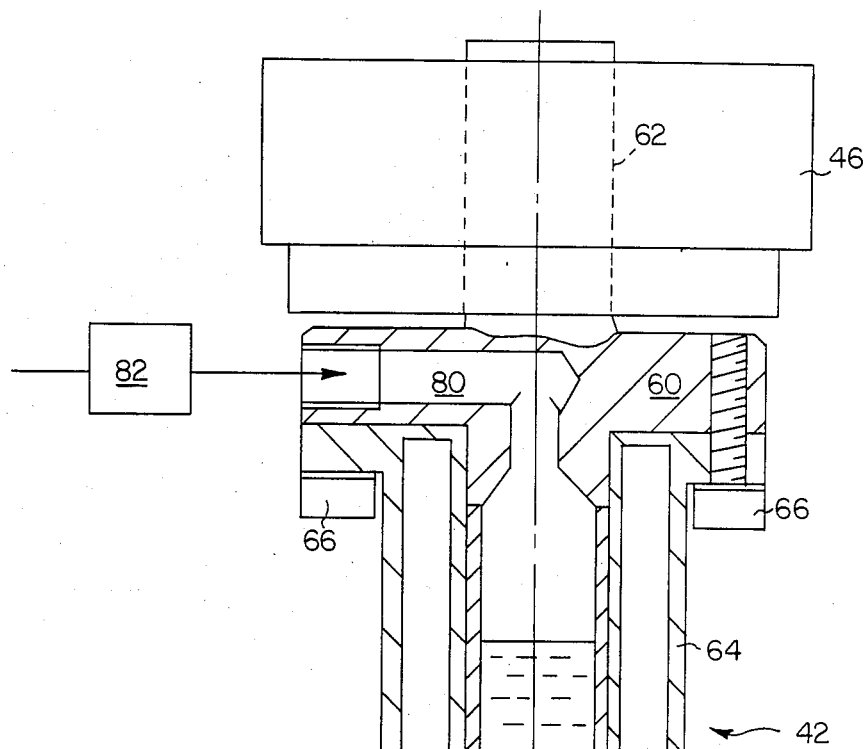
FIG. 3 is a sectional view of the writing head.
Figure 4:
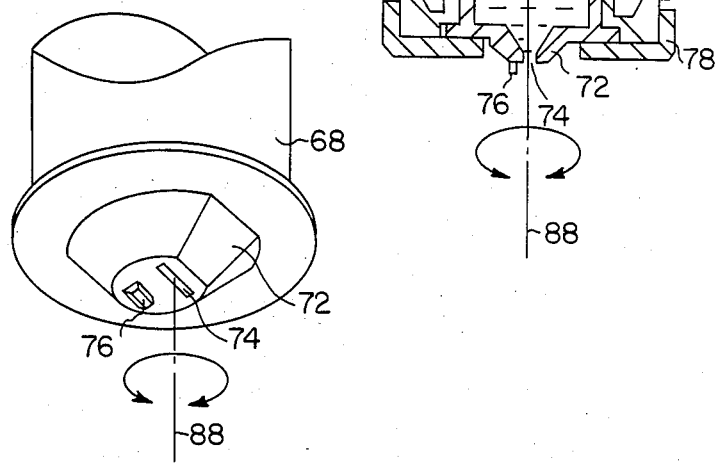
FIG. 4 is a perspective view showing the end part of the writing head.
Figure 5:
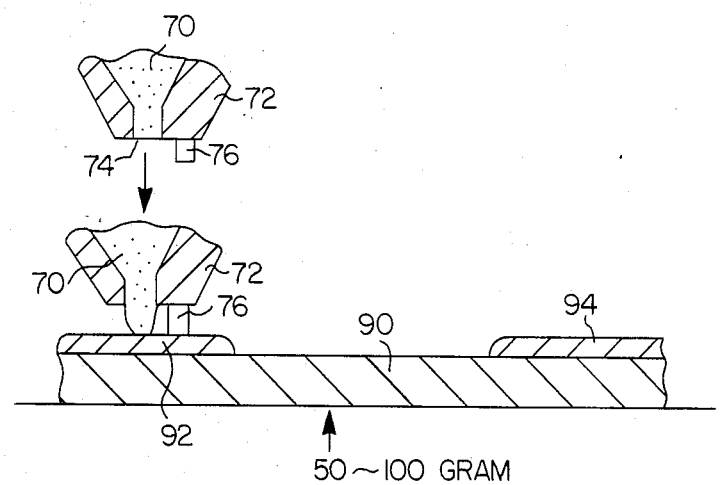
FIGS. 5, 6 and 7 are sectional views illustrating the writing operation of the pattern forming apparatus.

FIGS. 2 through 4 show the writing head unit 20, and the two writing heads 42, 44 are rotatably mounted with respect to the support plate 46. The support plate 46 is designed to be lifted and lowered by a drive servo motor 48 through a gear mechanism (not shown). The servo motor 48 includes a pulse encoder, the pulse output of which is counted to control the rotation. Since the writing heads 42, 44 are almost identical in structure, the writing head 42 is explained below as representative of both writing heads with reference to FIGS. 3 and 4. On the support plate 46 is rotatably mounted a rotating member 60 around a shaft of rotation 62. A warm water tank 64 is fixed to this rotating member 60 by nuts 66. This hot water tank is cylindrical, and a paste tank 68 is placed in the central hole of this cylinder so as to be put in and taken out freely. The paste tank 68 is filled with paste 70 for forming resistors and other elements of a thick film circuit. The paste 70, in an ordinary state, does not leak out from an elongated hole (for example, a slit of 100μ in length and 1 mm in width) 74 in a nozzle portion 72 disposed at the end of the tank 68. A diamond stylus tip 76 of about 40 μ in height is disposed near the hole 74 at the end surface of the nozzle portion 72. The paste tank 68 is prevented from slipping out by screwing a ring-shaped cover 78 to the end of the warm water tank 64. The rotating member 60 is also furnished with an air passage 80 for supply of air under pressure from a source of compressed air. When air is introduced into the air passage 80 by opening an electromagnetic valve 82, the paste 68 is forced out from the hole 74 in the nozzle portion 72. The paste is changed or replenished by removing the cover 78 and taking out the paste tank 68. The warm water tank 64 is designed to receive warm water, especially a constant temperature water (at, for example, 25° C.±0.2° C.), from an inlet 84 and discharge the water from an outlet 86. Thus, by enclosing the paste tank 68 with water at a constant temperature, the paste 70 may be maintained at a constant temperature and constant viscosity, so that the delivery of paste per unit time from the nozzle portion 72 may be controlled at a constant quantity.

The writing head 42 is, as mentioned above, rotatable, and its rotation center axis 88 runs through the center of the hole 74 in the nozzle portion 72. Therefore, however fast the writing head 42 may rotate, the center position of the hole 74 does not change and it is definitely defined. Meanwhile, the mechanisms of the X-axis, Y-axis, Z-axis drive units 32, 34, 28, 30, 24, 26 and the electromagnetic air valve 82 are controlled by a microcomputer (not shown). That is, the sequence of operations of the apparatus mentioned below is stored in the microcomputer, and the apparatus is designed to operate according to this stored sequence.

Referring next to FIGS. 5 through 8, the writing action of this pattern forming apparatus is described. As evident from FIGS. 5 through 7, the writing operation is executed basically as follows.

Figure 6:
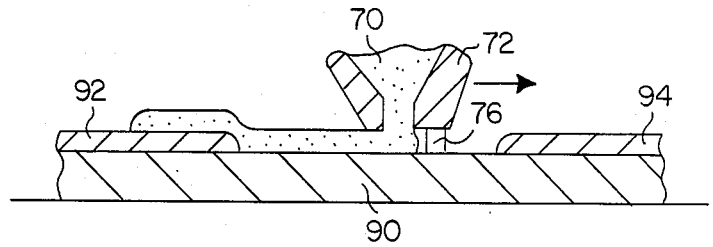
Figure 7:
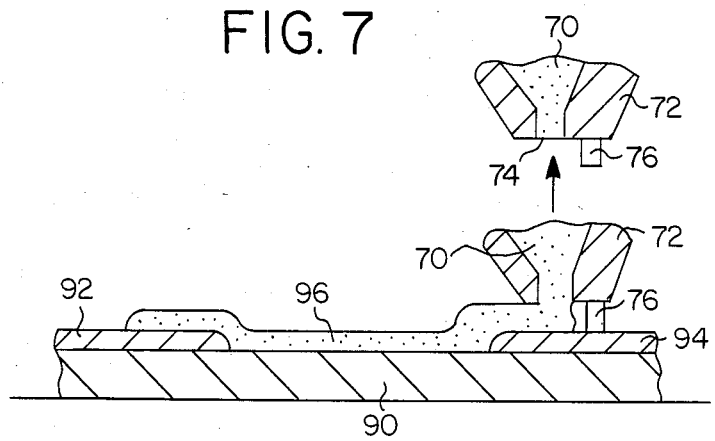

First, the writing head 42 descends, and its stylus tip 76 abuts against a conductor 92 on a thick film circuit board 90. At this time, a pressure of 50 to 100 grams is applied in the arrow direction in FIG. 5. In the next step, as shown in FIG. 6, the writing head moves in the arrow direction shown while its stylus tip 76 is contacting with the conductor 92 and the surface of the board 90. When the writing head 42 comes to a specified position on another conductor 94, as shown in FIG. 7, it ascends, and a resistor 96 is formed. In the course of this series of writing movements, the extrusion operation of the paste 70 is conducted as follows. That is, in the apparatus of this embodiment, the paste 70 is extruded simultaneously with horizontal movement of the writing head 42 along the top surface of the board 90, and extrusion ceases when the writing head stops.

Figure 8:
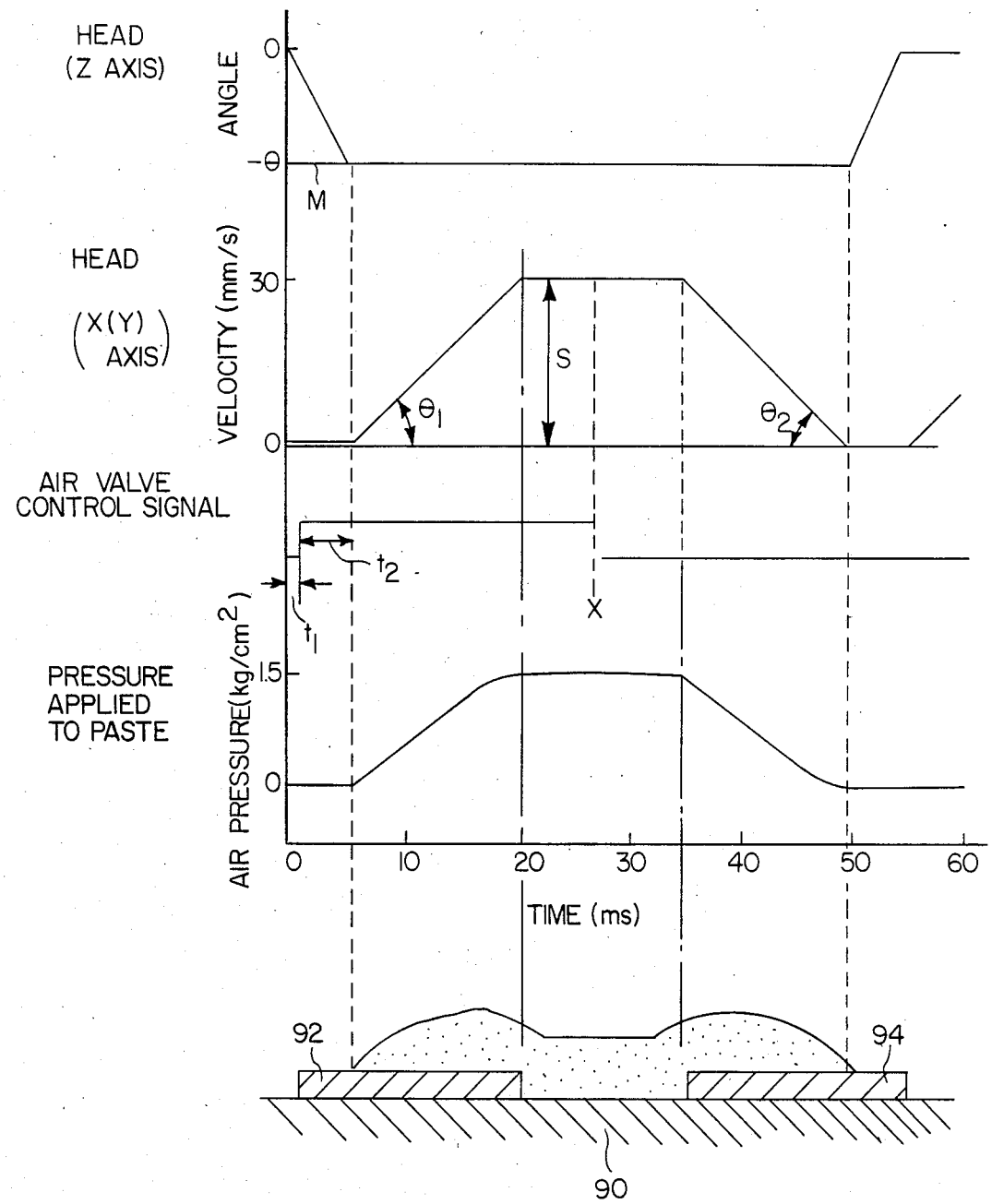
FIG. 8 is a explanatory view describing said writing operation.

To realize this relationship, the following structure is adopted in this embodiment. The writing head 42 is controlled by the microcomputer to move horizontally from an arbitrary point, and when it reaches above the conductor 92 on the board 90, it begins to lower toward the alumina ceramic board 90 which is used as the base of a thick film circuit. The travel from the highest position of the head 42 to the position abutting against the board 90 can be detected by the number of encoder pulses of the drive servo motor 48. By counting the number of pulses, it is detected when the head 42 comes to a certain position before abutting against the board 90, and the electromagnetic air valve 82 is opened at the same time. At this time, since there is a certain time gap from the supply of release command signal from the microcomputer to the air valve to the actual opening of the valve, and a certain time passes in the propagation of air pressure from the air valve 82 to the paste tank 68 through the air passage 80, the air valve 82 is opened in the midst of the process of lowering the head 42, so that the paste 70 may be forced out of the end of the nozzle exactly when the nozzle 72 comes into contact with the conductor 92 on the board 90. That is, as shown in FIG. 8, an air valve control signal is delivered while the head 42 is lowering in the Z-axis direction, i.e., in time $t_1$ from the lowering start point. When the head 42 is lowered completely and the nozzle 72 is about to contact with the board 90, an air pressure begins to be applied to the paste 70. The time $t_2$ from application of the release signal to the air valve until the actual application of air pressure to the paste is about 4 ms, but since this duration varies in each apparatus, in particular, the time required to release the electromagnetic air valve, $t_1$ is made variable so that the timing may be adjusted. The variable width of $t_1$ is 1 to 9 ms.

Then, while continuously forcing out the paste 70 by air pressure, the writing head 42 is moved laterally toward the conductor 94 at a high speed of 30 to 50 mm per second until reaching the position shown in FIG. 6, i.e., the position X in FIG. 8, when the application of a control signal to the electromagnetic air valve 82 is stopped, and the pressure in the paste tank is released until it is equal to the atmospheric pressure. At this time, the extrusion of the paste 70 does not stop instantly due to the time required to close the electromagnetic air valve and the time for releasing the air in the paste tank 68 to the atmosphere, but the extrusion of paste stops by the time the writing nozzle portion 72 reaches a specified position on the conductor 94. This stop timing of the control signal applied to the electromagnetic air valve 82 is determined by counting the number of plses from the X-axis, Y-axis drive motors 52, 50. That is, the distance required for the nozzle portion 72 to move between conductors 92 and 92 is preliminarily counted by the number of pulses from the motor and preset in the microcomputer, and the pulses are counted down along with the movement of the nozzle portion, and when reaching a specified number of remaining counts, the control signal to the valve 82 is stopped. Of course, since this stopping position varies with each apparatus, the number of specified remaining pulses is variable and is made adjustable.

As a result, the writing nozzle portion 72 is raised and moves to another arbitrary position, thus starts the next writing operation in a similar manner. In this way, a thick film resistor is written with a positional precision of 0.1 mm or less, and there is no defective pattern due to blurring or blotting either at the starting point or ending point of writing.

The moving speed S of the writing nozzle portion and the acceleration $\theta$ in starting and or ending are variable. By varying the moving speed, for instance, the resistance of the resistor may be changed. When the speed is reduced, the resistance is lowered, and when the speed is increased, the resistance is raised. This is possible because the output of paste per unit time is nearly constant. Or by varying the acceleration in starting and/or ending, the shape of writing at the start point and end point may be finely adjusted.

In this embodiment, meanwhile, the release control signal is sent to the electromagnetic air valve while the writing head is descending toward the board 90, but the same effect may be obtained by adopting the following sequence. That is, the release control signal is sent when the writing head descends completely on the board 90 (see point M in FIG. 8) and the horizontal movement of the head is started when the paste is ready to be extruded a specified time after the completion of the descending of the head.

As for the relative configuration of the writing nozzle and the board, and the speed thereof, it is sufficient when they are numerically controlled by the microcomputer, and in this embodiment the writing nozzle moves longitudinally, laterally and vertically while the board is fixed, but the same effect will be obtained when the writing nozzle is fixed and the board is moved longitudinally, laterally and vertically, or when the writing nozzle moves vertically while the board is moving longitudinally and laterally.

What is claimed is:

1. A method of forming thick film circuits, comprising laterally moving a writing head containing a paste for forming a thick film circuit relative to a board on which said circuit is to be formed while maintaining close proximity between said writing head and said board, extruding said paste from an extrusion means connected to said writing head by supplying pressure from a source of compressed air to the extrusion means to thereby deposit the paste on a top surface of said board, the supply of compressed air to said extrusion means being initiated at a predetermined time preceding the start of lateral movement of said writing head with respect to said board and the supply of said compressed air to said extrusion means being terminated at a predetermined time preceding termination of said lateral movement of said writing head.

2. A method of claim 1, wherein said extrusion means of said writing head has a stylus on an end face thereof, said stylus serving to allow said writing head to be kept separate from said board by a predetermined spacing.

3. A method of claim 1, wherein the speed of movement of said writing head and its rate of acceleration and deceleration are variable.

4. The method of claim 1, wherein said step of initiating and terminating the supply of said compressed air to said extrusion means is controlled so that said extrusion of paste from said writing head begins at the moment of said start of said lateral movement of said writing head and ends at the moment of said termination of said lateral movement of said writing head.

5. A method of forming thick film circuits, comprising:
(a) a first step in which a vertically movable writing head containing a paste for forming a thick film circuit is moved to an arbitrary point over a board on which a thick film circuit is to be formed while said head is kept vertically away from said board.
(b) a second step in which said writing head is brought into proximity with a top surface of said board,
(c) a third step in which said writing head is moved laterally to another arbitrary point over said board while it is maintained in proximity with said top surface of said board and said paste is extruded from an extrusion means of said writing head by supplying pressure from a source of compressed air to said extrusion means to thereby deposit said paste on said board surface, the supply of said compressed air to said extrusion means being initiated at a predetermined time preceding the start of lateral movement of said writing head with respect to said board and the supply of compressed air to said extrusion means being terminated at a predetermined time preceding termination of said lateral movement of said writing head, and (d) a fourth step in which said writing head is moved away from said top surface of said board.

6. The method of claim 5, wherein said steps of initiating and terminating the supply of said compressed air to said extrusion means are controlled so that said extrusion of paste from said writing head begins at the moment of said start of said lateral movement of said writing head and ends at the moment of said termination of said lateral movement of said writing head.

* * * * *